United States Patent
Shizuki

(10) Patent No.: US 7,349,506 B2
(45) Date of Patent: Mar. 25, 2008

(54) SEMICONDUCTOR INTEGRATED CIRCUIT AND METHOD FOR TESTING THE SAME

(75) Inventor: Yasushi Shizuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 638 days.

(21) Appl. No.: 10/901,165

(22) Filed: Jul. 29, 2004

(65) Prior Publication Data

US 2005/0201500 A1   Sep. 15, 2005

(30) Foreign Application Priority Data

Mar. 10, 2004   (JP)   ............... 2004-067206

(51) Int. Cl.
*H04B 1/10* (2006.01)
(52) U.S. Cl. .............. 375/350; 375/373; 375/375; 375/376; 375/316; 375/224; 714/703; 714/706; 714/704; 714/715; 714/814
(58) Field of Classification Search .......... 375/219, 375/316, 295, 226, 224, 350
See application file for complete search history.

(56) References Cited

U.S. PATENT DOCUMENTS

| | | | | |
|---|---|---|---|---|
| 5,787,114 | A * | 7/1998 | Ramamurthy et al. | 375/221 |
| 5,859,881 | A * | 1/1999 | Ferraiolo et al. | 375/350 |
| 6,076,175 | A | 6/2000 | Drost et al. | |
| 6,861,868 | B1 * | 3/2005 | Agrawal et al. | 326/38 |
| 7,218,670 | B1 * | 5/2007 | Lesea et al. | 375/226 |
| 2004/0247022 | A1 * | 12/2004 | Raghavan et al. | 375/219 |
| 2005/0135501 | A1 * | 6/2005 | Chang et al. | 375/295 |

* cited by examiner

*Primary Examiner*—Chieh M. Fan
*Assistant Examiner*—Siu M Lee
(74) *Attorney, Agent, or Firm*—Oblon, Spivak, McClelland, Maier & Neustadt, P.C.

(57) ABSTRACT

A method and semiconductor integrated circuit in which a receiver receives reception data and executes reception processing on the basis of a clock signal supplied from a PLL and a transmitter which receives parallel transmission data and executes serial transmission processing on the basis of the clock signal, and having a loop back function of supplying data output from the transmitter to the receiver for test. The receiver capable of executing control so as to make a phase of the input data coincide with that of a recovery clock.

15 Claims, 8 Drawing Sheets

SEMICONDUCTOR INTEGRATED CIRCUIT AND METHOD FOR TESTING THE SAME

CROSS REFERENCE TO RELATED APPLICATION

This application is based upon and claims benefit of priority under 35 USC §119 from the Japanese Patent Application No. 2004-67206, filed on Mar. 10, 2004, the entire contents of which are incorporated herein by reference.

BACKGROUND OF THE INVENTION

The present invention relates to a semiconductor integrated circuit and a method for testing the same and, more particularly, to a semiconductor integrated circuit and a test method which are suitable for a GHz-class high-speed I/O interface.

Along with the recent increase in speed of the input/output interface of a semiconductor integrated circuit, a demand has arisen for processing signals in a GHz band.

FIG. 6 shows the arrangement of a transmitter (TX) 50, receiver (RX) 51, and PLL (Phase Locked Loop) 52 used in an input interface.

The transmitter 50 receives low-speed parallel transmission data, converts the data into high-speed serial data, and outputs the converted data.

The receiver 51 receives high-speed serial reception data, converts the data into low-speed parallel data, and outputs the converted data to a data processing circuit (not shown).

The transmitter 50 and receiver 51 use the common PLL 52 as a clock source.

The receiver 51, transmitter 50, and PLL 52 are incorporated in a single chip. A reference frequency source 53 which generates a reference frequency to be used by the PLL 52 is arranged outside the chip.

FIG. 7 shows the arrangement of a clock data recovery (to be referred to as a CDR hereinafter) circuit included in the receiver 51.

The receiver 51 comprises a phase comparator 61, serial/parallel converter 62, digital filter 63, control circuit 64, and phase interpolator 65.

The phase comparator 61 retimes (samples) input data by a recovery clock. Simultaneously, the phase comparator 61 determines whether the phase relationship between the recovery clock and the input data advances or delays from an optimum value. When the phase advances from the optimum value, a down signal is output together with the recovery data. When the phase delays from the optimum value, an up signal is output together with the recovery data.

The serial/parallel converter 62 receives the recovery data and the up or down signal from the phase comparator 61 and converts the data into a low-speed parallel signal.

The digital filter 63 averages the paralleled up or down signals output from the serial/parallel converter 62, compares the number of up signals with the number of down signals at a predetermined time interval, and sends the up or down signal to the control circuit 64, when the accumulated numbers of paralleled up or down pulses reaches the predetermined threshold value.

The control circuit 64 receives the up or down signal, generates a control signal to decide the mixing ratio of clocks with different phases, and supplies the control signal to the phase interpolator 65.

The phase interpolator 65 receives the control signal output from the control circuit 64 and a reference clock signal with a phase of 0° or 90° output from the PLL 52. The phase interpolator 65 generates clock signals of 180° and 270° inside, mixes the clocks with different phases on the basis of the control signal to generate a clock signal (to be referred to as a recovery clock hereinafter) having a specific phase, and outputs the clock signal to the phase comparator 61.

As described above, the CDR circuit is a negative feedback loop circuit. A recovery clock phase with which the phase relationship between the data input to the phase comparator 61 and the recovery clock has the largest margin can be generated.

Such a CDR circuit is required to have a capability for normally recovering data even when the frequency value of the bit rate of input data and that of the reference clock signal supplied from the PLL 52 have a difference, namely a transmitter and the CDR are plesiochronous operation.

A case will be examined in which a chip having a transmitter 50a, receiver 51a, and PLL 52a and a chip having a transmitter 50b, receiver 51b, and PLL 52b are separately prepared, as shown in FIG. 8. Assume that reference clocks having different frequencies $f_{ref1}$ and $f_{ref2}$ are supplied from different reference frequency sources to the PLLs 52a and 52b. Data received by the receiver 51a is transmitted by the transmitter 50a and received by the receiver 51b. In addition, data transmitted by the transmitter 50b is received by the receiver 51a and transmitted by the transmitter 50a.

In this case, the bit rate of input data and the clock signal supplied from the PLL 52a or 52b have a frequency difference.

Before shipment of transmitters/receivers, the capability for absorbing such a frequency difference must be tested.

To do this test, the clock signal on the transmitter side and that on the receiver side must have a frequency difference.

In the transmitter/receiver having the arrangement shown in FIG. 6, the transmitter 50 and receiver 51, which are mounted on the same chip, shares the single PLL 52. For this reason, no clock signals having a frequency difference can be generated, and the test cannot be executed.

Conventionally, the test must be executed by connecting two transmitters/receivers having different reference frequency sources.

However, this test method is not suitable for mass production because it is time-consuming, and it is difficult to control the frequency difference between the two reference frequency sources.

As another test method executed without connecting different chips, there is a loop back test method which makes it possible to input the output signal from the transmitter 50 in the same chip to the receiver 51 by switching an external signal, as shown in FIG. 9.

However, even when the loop back test method is used, the transmitter 50 and receiver 51 in the same chip use the same clock frequency, as described above. Hence, no data transmission/reception test can be executed assuming that the transmitter 50 and receiver 51 have a frequency difference.

As described above, conventionally, it is difficult to execute a data transmission/reception test assuming that the transmitter and receiver use clock signals having different frequencies.

SUMMARY OF THE INVENTION

According to one aspect of the present invention, there is provided a semiconductor integrated circuit comprising a receiver which receives reception data and executes reception processing on the basis of a clock signal supplied from a PLL and a transmitter which receives parallel transmission data and executes serial transmission processing on the basis of the clock signal, and having a loop back function of supplying data output from the transmitter to the receiver for test, the receiver, as a clock data recovery (to be referred to as a CDR hereinafter) circuit, executing control so as to make the phase of the input data coincide with that of the recovery clock by a negative feedback loop having a phase comparator which receives input data and a recovery clock, compares a phase of the input data with that of the recovery clock, and outputs recovery data and a phase comparison result in a serial form, a serial/parallel conversion circuit which receives the phase comparison result, or the phase comparison result and the recovery data from said phase comparator, executes serial/parallel conversion, and outputs the phase comparison result in a parallel form, a digital filter which receives the phase comparison result from said serial/parallel conversion circuit, executes averaging processing for the phase comparison result in a predetermined period, and outputs the phase comparison result, a control circuit which receives the phase comparison result from said digital filter and outputs a control signal to control the phase of the recovery clock, and a phase interpolator which receives the clock signal and generates the recovery clock on the basis of the control signal, and the CDR circuit including a signal output circuit which inputs, to one of said control circuit and said digital filter, a signal to forcibly shift the phase of the recovery data in the negative feedback loop by a predetermined amount, a first counter which counts the number of pulses of the signal output from said signal output circuit in a predetermined period and outputs a first count value, a second counter which counts the number of pulses of the phase comparison result, which has undergone the averaging processing and is output from said digital filter, and outputs a second count value, and a signal processing circuit which receives the first count value and the second count value and compares the first count value with the second count value to determine presence/absence of a capability for absorbing the phase shift generated by the signal.

According to one aspect of the present invention, there is provided a test method for a semiconductor integrated circuit comprising a receiver which receives reception data and executes reception processing on the basis of a clock signal supplied from a PLL and a transmitter which receives parallel transmission data and executes serial transmission processing on the basis of the clock signal, and having a loop back function of supplying data output from the transmitter to the receiver for test, the receiver, as a CDR circuit, executing control so as to make the phase of the input data coincide with that of the recovery clock by a negative feedback loop having a phase comparator which receives input data and a recovery clock, compares a phase of the input data with that of the recovery clock, and outputs recovery data and a phase comparison result in a serial form, a serial/parallel conversion circuit which receives the phase comparison result, or the phase comparison result and the recovery data from the phase comparator, executes serial/parallel conversion, and outputs the phase comparison result in a parallel form, a digital filter which receives the phase comparison result from the serial/parallel conversion circuit, executes averaging processing for the phase comparison result in a predetermined period, and outputs the phase comparison result, a control circuit which receives the phase comparison result from the digital filter and outputs a control signal to control the phase of the recovery clock, and a phase interpolator which receives the clock signal and generates the recovery clock on the basis of the control signal, and the CDR circuit including a signal output circuit which inputs, to one of the control circuit and the digital filter, a signal to forcibly shift the phase of the recovery data in the negative feedback loop by a predetermined amount, a first counter which counts the number of pulses of the signal output from the signal output circuit in a predetermined period and outputs a first count value, a second counter which counts the number of pulses of the phase comparison result, which has undergone the averaging processing and is output from the digital filter, and outputs a second count value, and a signal processing circuit which receives the first count value and the second count value and compares the first count value with the second count value to determine presence/absence of a capability for absorbing the phase shift generated by the signal, the method comprising, in testing the semiconductor integrated circuit, the steps of:

in a locked state of the CDR circuit, causing the signal output circuit to input, to one of the control circuit and the digital filter, the signal to forcibly shift the phase of the recovery data in the negative feedback loop by the predetermined amount; and causing the signal processing circuit to determine the presence/absence of the capability for absorbing by the negative feedback loop the phase shift generated by the signal.

DESCRIPTION OF THE PREFERRED EMBODIMENTS

The embodiments of the present invention will be described below with reference to the accompanying drawings.

(1) First Embodiment

Figure 1:
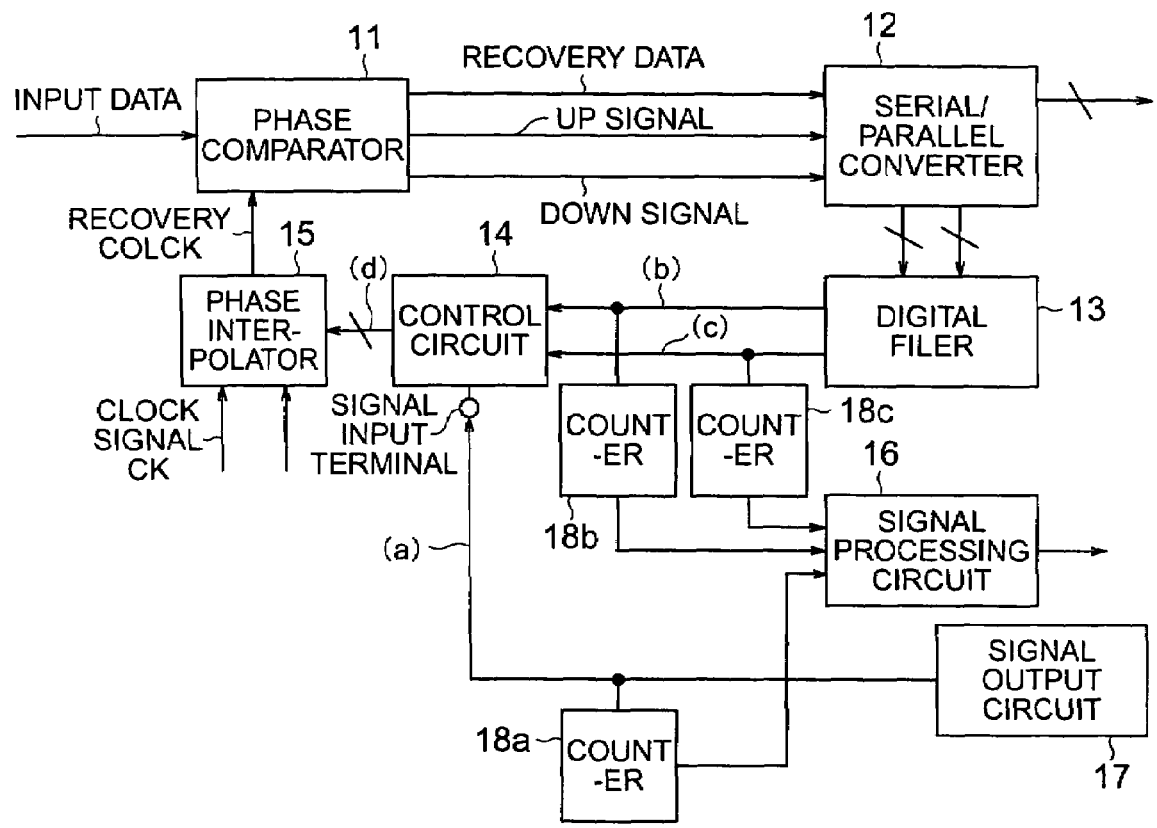
FIG. 1 is a circuit diagram showing the arrangement of a semiconductor integrated circuit according to the first embodiment of the present invention.
Figure 9:
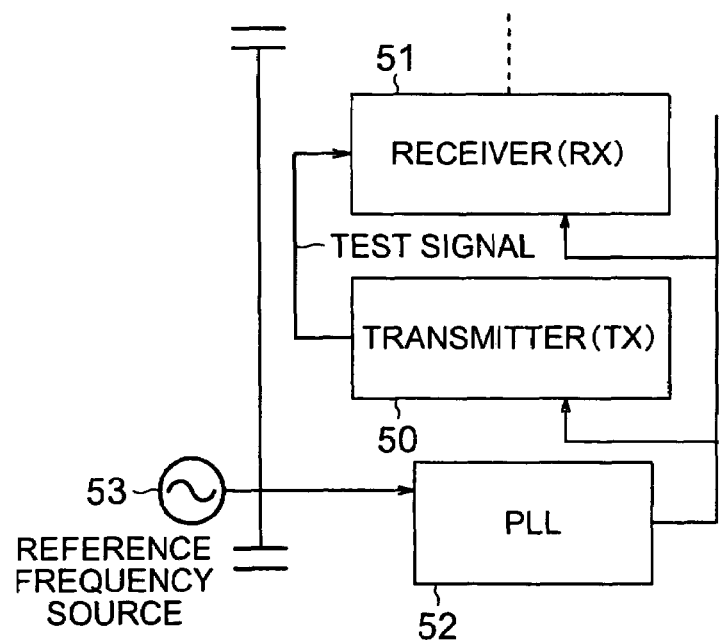
FIG. 9 is a circuit diagram showing the arrangement of a circuit when a conventional loop back test method is executed.

FIG. 1 shows the arrangement of a CDR circuit included in the receiver in a semiconductor integrated circuit according to the first embodiment of the present invention. The arrangement of the transmitter/receiver is the same as that shown in FIG. 6. In a loop back test, a test signal output from a transmitter 50 is input to a receiver 51, as shown in FIG. 9.

The CDR circuit comprises a signal processing circuit 16, signal output circuit 17, and counters 18a, 18b, and 18c in addition to a phase comparator 11, serial/parallel converter 12, digital filter 13, control circuit 14, and phase interpolator 15.

Figure 7:
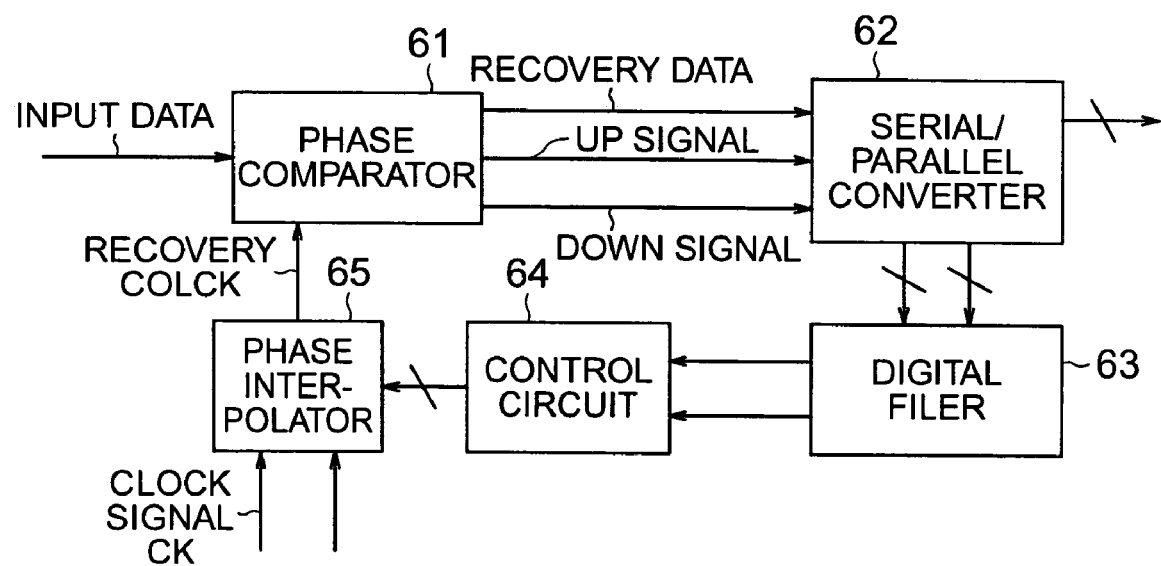
FIG. 7 is a circuit diagram showing the arrangement of a conventional CDR (Clock Data Recovery) circuit.
Figure 8:
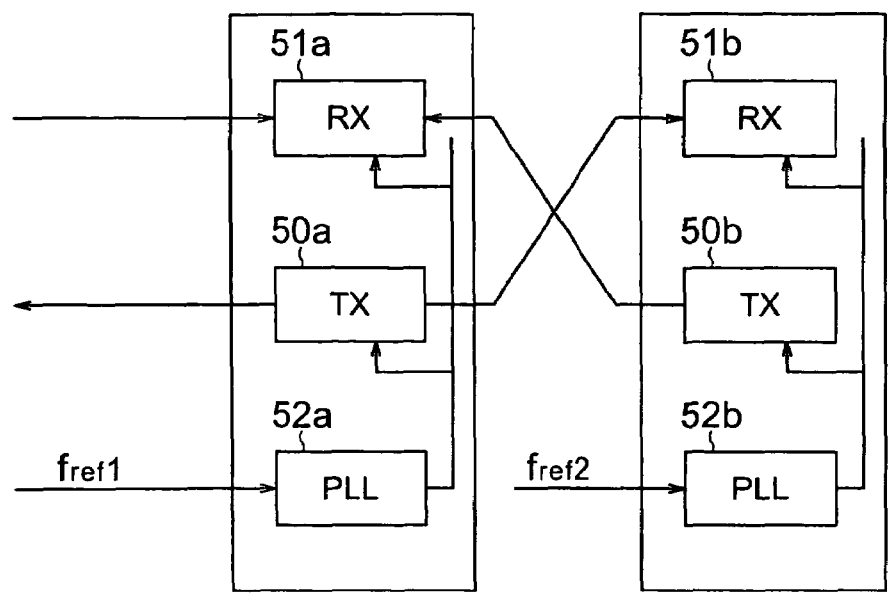
FIG. 8 is a block diagram showing an arrangement when data is to be transmitted/received between a transmitter and a receiver, which are arranged in different chips.

The operations of the phase comparator 11, serial/parallel converter 12, digital filter 13, control circuit 14, and phase interpolator 15 are the same as those of the circuits shown in FIG. 7, and a description thereof will be omitted.

The signal output circuit 17 inputs a signal having a predetermined frequency difference necessary for the loop back test to the control circuit 14, thereby forcibly generating the frequency difference.

The counter 18a receives an output (a) from the signal output circuit 17, counts the number of pulses in a predetermined period, and outputs the count result to the signal processing circuit 16.

The counters 18b and 18c respectively receive outputs (b: up signal) (c: down signal) from the digital filter 13, count the numbers of pulses in a predetermined period, and output the count results to the signal processing circuit 16.

The signal processing circuit 16 receives the outputs (a, b, and c) from the counters 18a to 18c and determines the presence/absence of the capability for absorbing the frequency difference of the negative feedback loop in the CDR circuit.

Figure 6:
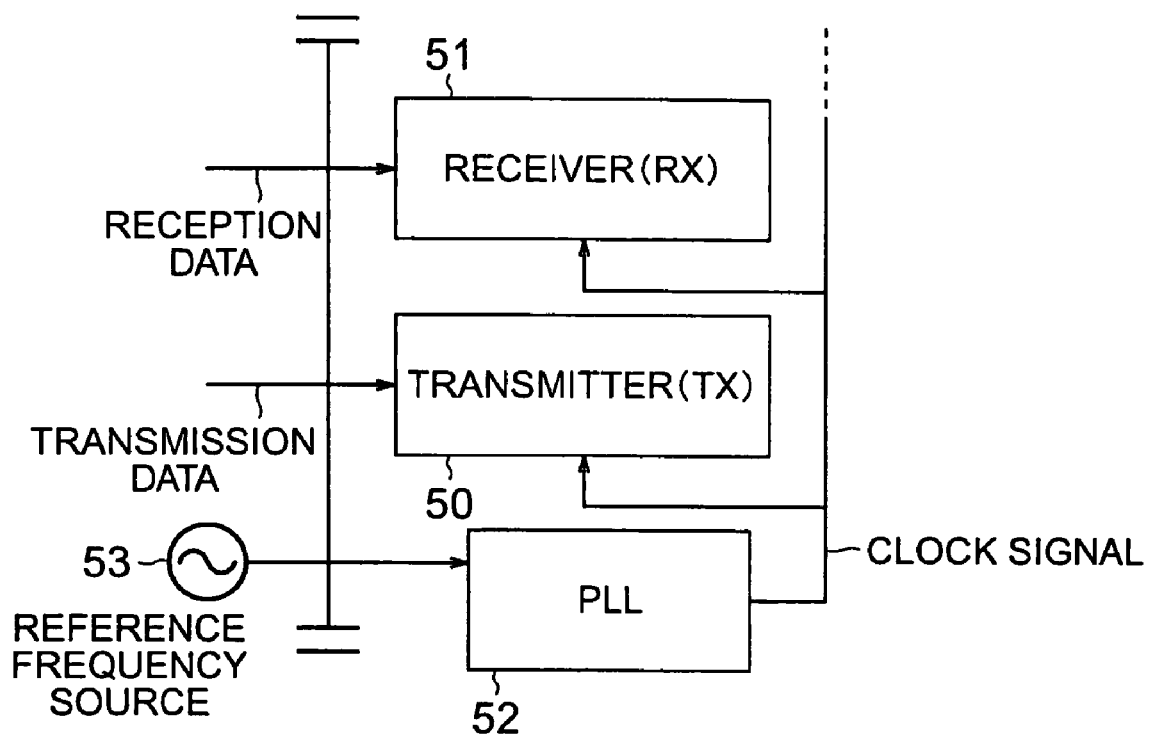
FIG. 6 is a block diagram showing the arrangement of a conventional transmitter/receiver.

In the first embodiment, even when the negative feedback loop of the CDR circuit is formed, the signal (a) output from the signal output circuit 17 can be input to a signal input terminal prepared in the control circuit 14, unlike the conventional circuit arrangement shown in FIG. 6.

In a locked state by the negative feedback loop of the CDR circuit, a signal corresponding to a predetermined frequency difference is input from the signal output circuit 17. When the negative feedback loop of the CDR circuit has the capability for absorbing the frequency difference, a signal that cancels the frequency difference that should be generated by the output signal (a) from the signal output circuit 17 is output from the phase comparator 11.

Figure 2:
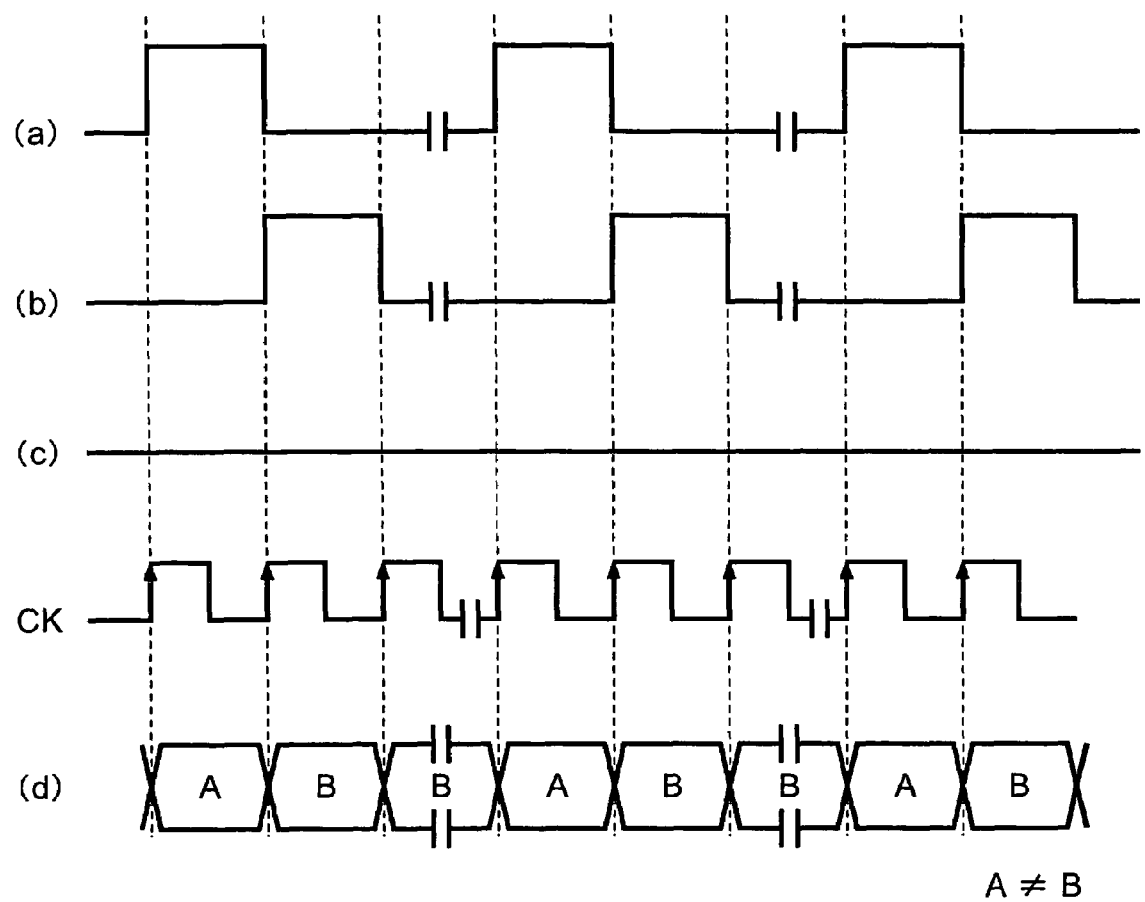
FIG. 2 is a timing chart showing the waveforms of signals in the semiconductor integrated circuit.

FIG. 2 shows the operation waveforms of the signals (a) to (c), a clock signal CK, and an output signal (d) from the control circuit 14.

For example, the output signal (a) from the signal output circuit 17 is a signal that makes the frequency of the recovery clock lower than that of the clock signal. When the signal (a) is input to the control circuit 14, the up signal (b) is generated by the phase comparator 11. The down signal (c) is not generated.

The clock signal CK is a reference clock signal input to the phase interpolator 15. The signal (d) is a signal input from the control circuit 14 to the phase interpolator 15.

In this CDR circuit, to cancel the frequency difference generated by the signal (a) that is newly input to the control circuit 14, the signal (b) which has the same interval as that of the signal (a) and moves the frequency in a reverse direction is generated.

In this case, the output signal (d) from the control circuit 14 changes while only causing transition between two adjacent states "A" and "B", as shown in FIG. 2. Accordingly, the phase of the recovery clock output from the phase interpolator 15 has the same value as the bit rate of the input data. When the signal (d) is shifting from "A" to "A", it means that the state is maintained. When the signal (d) is shifted from "A" to "B", it means that transition to the adjacent state has occurred.

In the CDR circuit having the above arrangement, the following operation is executed in determining the capability for absorbing the frequency difference between the clock and the bit rate of input data.

The counter 18a which receives the output signal (a) from the signal output circuit 17 and the counters 18b and 18c which receive the output signals (b) and (c) from the digital filter 13 measure changes in the respective signals for a predetermined period. The signal processing circuit 16 measures whether the count value from the counter 18a which receives the signal (a) coincides with the count value from one of the counters 18b and 18c which receive the signals (b) and (c) within a predetermined range. When the count values coincide within the predetermined range, it is determined that the capability for absorbing the predetermined frequency difference input from the signal output circuit 17 is present. Otherwise, it is determined that the absorbing capability is not present. Accordingly, the presence/absence of the capability can be discriminated.

All the measurements are done on the basis of the low-speed clock signal after serial/parallel conversion. Hence, power consumption can be reduced. In addition, the frequency difference absorbing capability of the CDR circuit can be verified by using the loop back test in a simple circuit arrangement.

Figure 3:
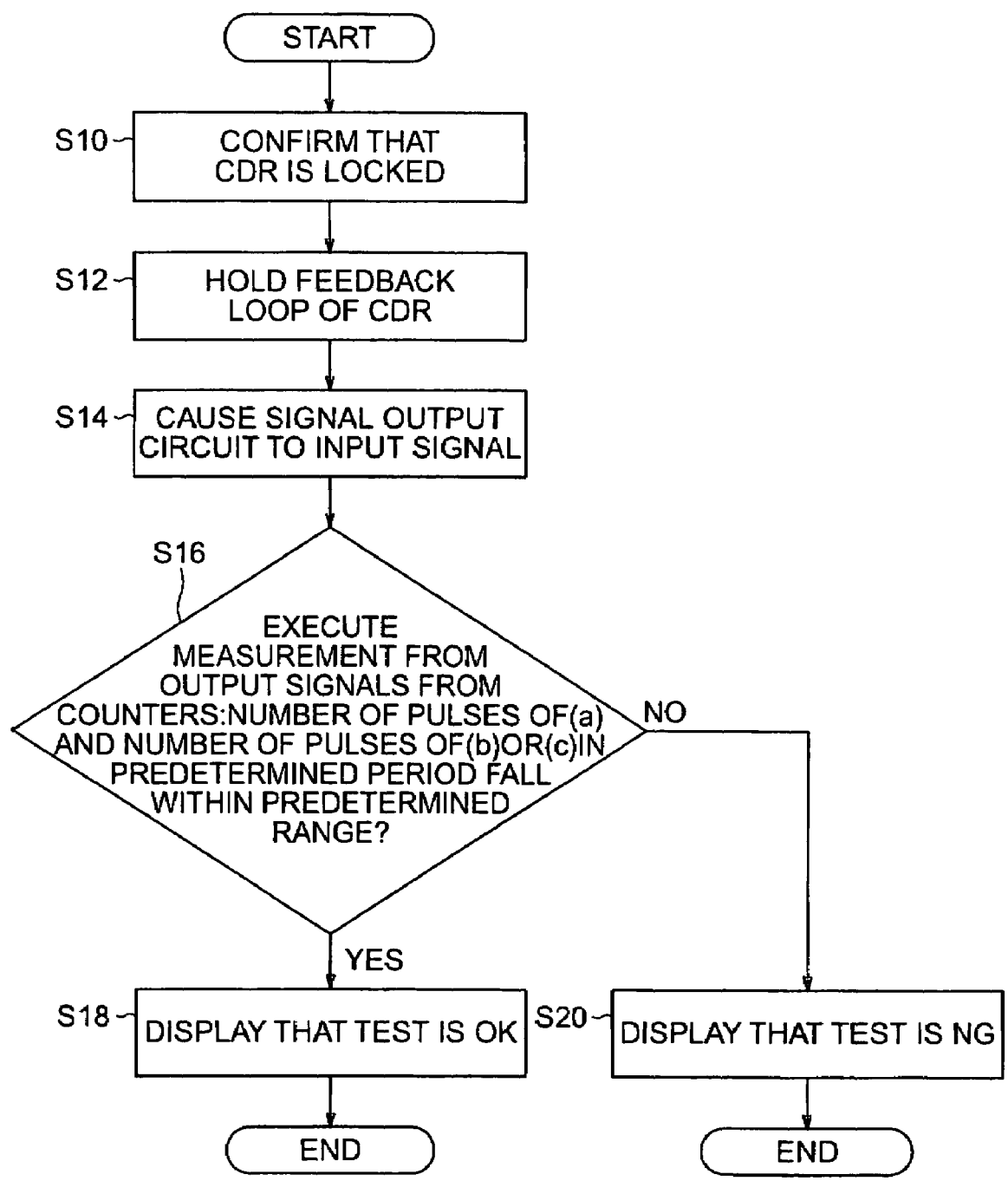
FIG. 3 is a flowchart showing a test method for the semiconductor integrated circuit according to the first embodiment of the present invention.

FIG. 3 is a flowchart showing the sequence of verifying the frequency difference absorbing capability of the CDR circuit according to the first embodiment.

In step S10, it is confirmed that the CDR circuit is locked. For example, when a data error detector (to be described later) is present, it may be confirmed that the data error detector is locked.

In step S12, the feedback loop of the CDR circuit is held.

In step S14, the signal output circuit 17 supplies the signal (a) corresponding to a predetermined frequency difference to the control circuit 14.

In step S16, the counter 18a counts the number of pulses of the output signal (a) from the signal output circuit 17, the counter 18b counts the number of pulses of the output signal (b) from the digital filter 13, and the counter 18c counts the number of pulses of the output signal (c) from the digital filter 13. The count values are supplied to the signal processing circuit 16.

The signal processing circuit 16 determines whether the number of pulses of each of the signals (a) to (c) falls within a predetermined range.

For example, assume that the signal (a) that shifts the frequency in an increasing direction is supplied from the signal output circuit 17. If the difference between the number of pulses of the signal (a) within the predetermined period and the number of pulses of the down signal (c) from the digital filter 13 within the predetermined period falls within the predetermined range, the capability for absorbing the frequency difference generated by the signal (a) is present.

Similarly, assume that the signal (a) that shifts the frequency in a decreasing direction is supplied from the signal output circuit 17. If the difference between the number of pulses of the signal (a) within the predetermined period and the number of pulses of the up signal (b) from the digital filter 13 within the predetermined period falls within the predetermined range, the capability for absorbing the frequency difference generated by the signal (a) is present.

When the signal processing circuit 16 determines that the numbers of pulses of the signals (a) and (b) or the numbers of pulses of the signals (a) and (c) fall within the predetermined range, a test result representing that the CDR circuit has the desired frequency difference absorbing capability is obtained and displayed on a display apparatus (not shown) or the like in step S18.

When the signal processing circuit 16 determines that the numbers of pulses do not fall within the predetermined range, a test result representing that the CDR circuit does not have the desired frequency difference absorbing capability is obtained and displayed in step S20.

(2) Second Embodiment

Figure 4:
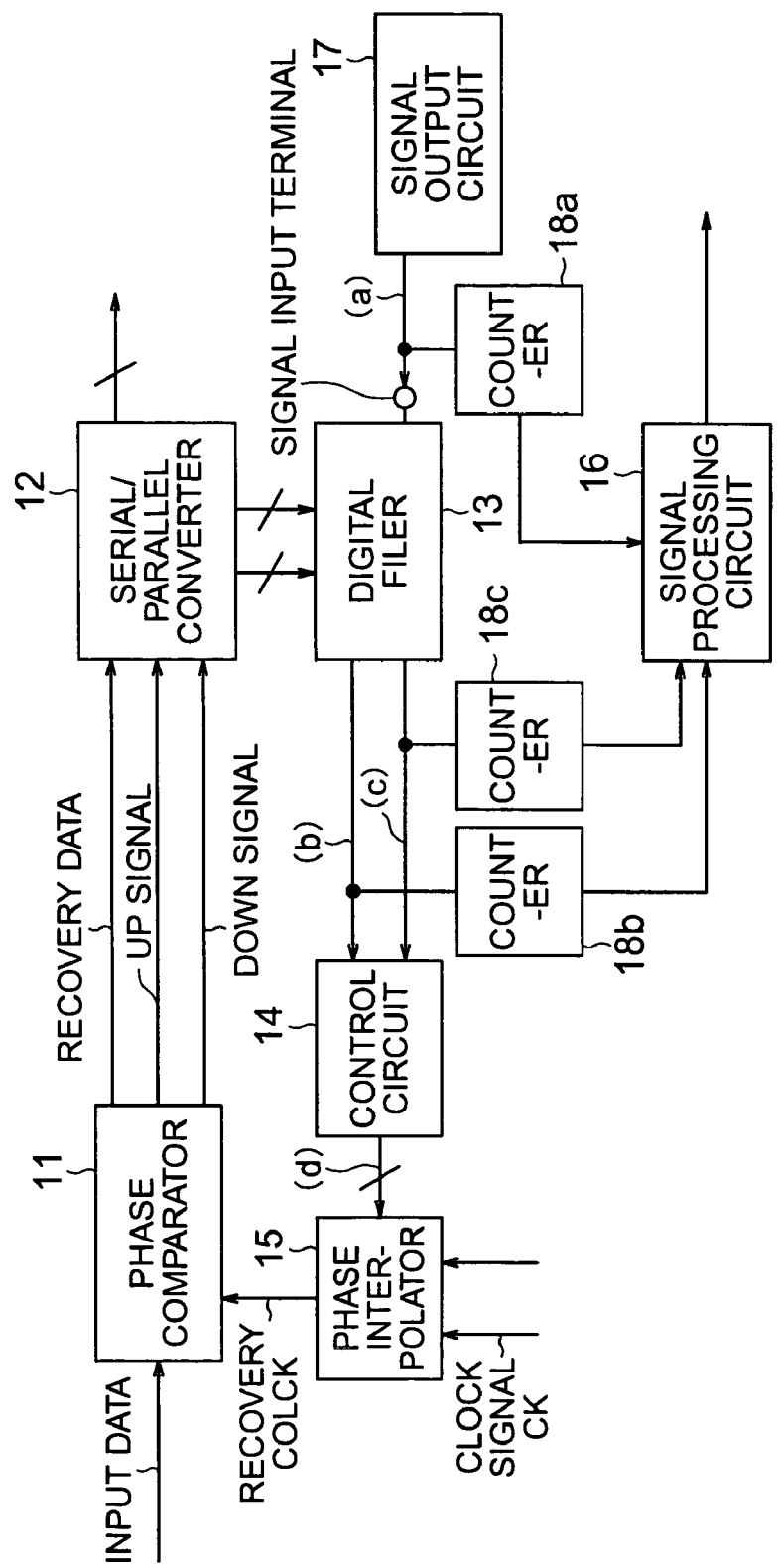
FIG. 4 is a circuit diagram showing the arrangement of a semiconductor integrated circuit according to the second embodiment of the present invention.

FIG. 4 shows the circuit arrangement of the second embodiment of the present invention.

In the first embodiment, the signal output circuit 17 supplies the signal (a) corresponding to a specific frequency difference to the control circuit 14.

The second embodiment is different from the first embodiment in that a signal output circuit 17 supplies a generated signal (a) to a digital filter 13. The same reference numerals as in the first embodiment denote the same elements in the second embodiment, and a description thereof will be omitted.

Even in the second embodiment, the frequency difference absorbing capability of the CDR circuit can easily be verified by executing a loop back test, as in the first embodiment.

(3) Third Embodiment

Figure 5:
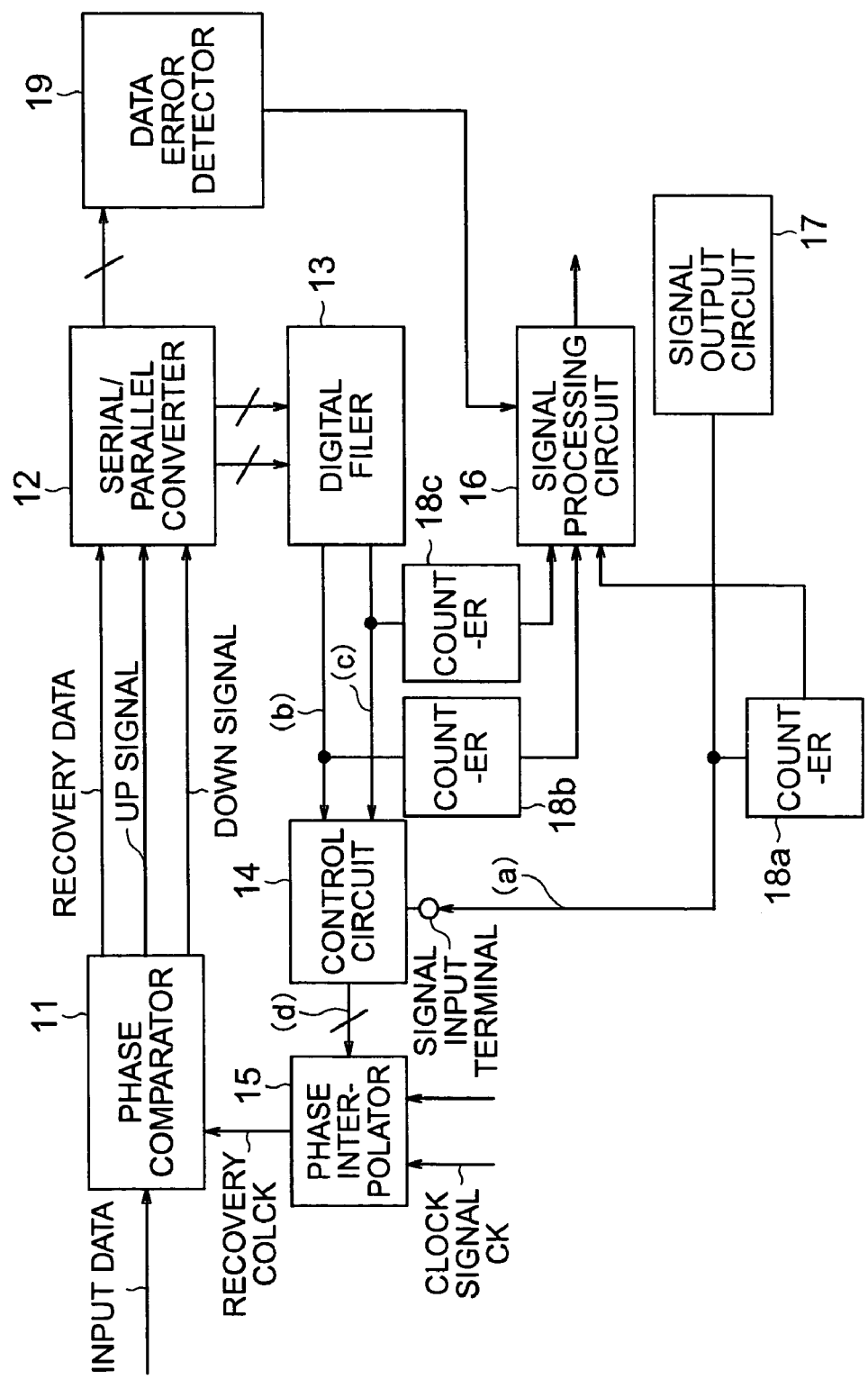
FIG. 5 is a circuit diagram showing the arrangement of a semiconductor integrated circuit according to the third embodiment of the present invention.

FIG. 5 shows the circuit arrangement of the third embodiment of the present invention.

In the third embodiment, a data error detector 19 is added to the arrangement of the first embodiment.

The data error detector 19 is connected to the output terminal of a serial/parallel converter 12 and the input terminal of a signal processing circuit 16. The data error detector 19 receives recovery data output from the serial/parallel converter 12, compares the recovery data with input data, and outputs the comparison result to the signal processing circuit 16.

According to the third embodiment, by using both the determination result from the signal processing circuit 16 and the comparison result output from the data error detector 19, the frequency difference absorbing capability of the CDR circuit can more accurately be verified, as in the first embodiment.

As described above, according to the semiconductor integrated circuits according to the first to third embodiments and test methods therefor, the frequency absorbing capability characteristic of a receiver when the clock frequency and the bit rate of input data to the receiver have a difference can easily be tested by only the loop back test.

The above-described embodiments are merely examples which do not limit the present invention. Various changes and modifications can be made within the technical scope of the present invention.

What is claimed is:

1. A semiconductor integrated circuit comprising a receiver which receives reception data and executes reception processing on the basis of a clock signal supplied from a PLL and a transmitter which receives parallel transmission data and executes serial transmission processing on the basis of the clock signal, and having a loop back function of supplying data output from the transmitter to the receiver for test, the receiver, as a clock data recovery (to be referred to as a CDR hereinafter) circuit, executing control so as to make the phase of the input data coincide with that of the recovery clock by a negative feedback loop having a phase comparator which receives input data and a recovery clock, compares a phase of the input data with that of the recovery clock, and outputs recovery data and a phase comparison result in a serial form, a serial/parallel conversion circuit which receives the phase comparison result, or the phase comparison result and the recovery data from said phase comparator, executes serial/parallel conversion, and outputs the phase comparison result in a parallel form, a digital filter which receives the phase comparison result from said serial/parallel conversion circuit, executes averaging processing for the phase comparison result in a predetermined period, and outputs the phase comparison result, a control circuit which receives the phase comparison result from said digital filter and outputs a control signal to control the phase of the recovery clock, and a phase interpolator which receives the clock signal and generates the recovery clock on the basis of the control signal, and the CDR circuit including a signal output circuit which inputs, to one of said control circuit and said digital filter, a signal to forcibly shift the phase of the recovery data in the negative feedback loop by a predetermined amount, a first counter which counts the number of pulses of the signal output from said signal output circuit in a predetermined period and outputs a first count value, a second counter which counts the number of pulses of the phase comparison result, which has undergone the averaging processing and is output from said digital filter, and outputs a second count value, and a signal processing circuit which receives the first count value and the second count value and compares the first count value with the second count value to determine presence/absence of a capability for absorbing the phase shift generated by the signal.

2. A circuit according to claim 1, wherein said digital filter receives the phase comparison result from said serial/parallel conversion circuit, executes the averaging processing for the phase comparison result in the predetermined period, and outputs an up signal which advances the phase of the recovery data and a down signal which delays the phase of the recovery data, and said second counter counts the number of pulses of each of the up signal and the down signal, which are output from said digital filter, and outputs the second count value.

3. A circuit according to claim 2, wherein when the signal input from said signal output circuit to said digital filter is a signal which forcibly advances the phase of the recovery data in the negative feedback loop by the predetermined amount, said signal processing circuit compares the first count value with the number of pulses of the down signal contained in the second count value, and when a difference between the count values falls within a predetermined range, said signal processing circuit determines that the capability for absorbing the phase shift generated by the signal is present.

4. A circuit according to claim 1, wherein the receiver further comprises a data error detector which receives the recovery data output from said serial/parallel conversion circuit, compares the recovery data with the input data, and outputs a comparison result.

5. A circuit according to claim 4, wherein said signal processing circuit receives the comparison result output from said data error detector and executes determination on the basis of the comparison result and a result obtained by determining whether a difference between the first count value and the second count value falls within a predetermined range.

6. A circuit according to claim 2, wherein the receiver further comprises a data error detector which receives the recovery data output from said serial/parallel conversion circuit, compares the recovery data with the input data, and outputs a comparison result.

7. A circuit according to claim 6, wherein said signal processing circuit receives the comparison result output from said data error detector and executes determination on the basis of the comparison result and a result obtained by determining whether a difference between the first count value and the second count value falls within a predetermined range.

8. A circuit according to claim 3, wherein the receiver further comprises a data error detector which receives the recovery data output from said serial/parallel conversion circuit, compares the recovery data with the input data, and outputs a comparison result.

9. A circuit according to claim 8, wherein said signal processing circuit receives the comparison result output from said data error detector and executes determination on the basis of the comparison result and a result obtained by determining whether a difference between the first count value and the second count value falls within a predetermined range.

10. A test method for a semiconductor integrated circuit comprising a receiver which receives reception data and executes reception processing on the basis of a clock signal supplied from a PLL and a transmitter which receives parallel transmission data and executes serial transmission processing on the basis of the clock signal, and having a loop back function of supplying data output from the transmitter to the receiver for test, the receiver, as a CDR circuit, executing control so as to make the phase of the input data coincide with that of the recovery clock by a negative feedback loop having a phase comparator which receives input data and a recovery clock, compares a phase of the input data with that of the recovery clock, and outputs recovery data and a phase comparison result in a serial form, a serial/parallel conversion circuit which receives the phase comparison result, or the phase comparison result and the recovery data from the phase comparator, executes serial/parallel conversion, and outputs the phase comparison result in a parallel form, a digital filter which receives the phase comparison result from the serial/parallel conversion circuit, executes averaging processing for the phase comparison result in a predetermined period, and outputs the phase comparison result, a control circuit which receives the phase comparison result from the digital filter and outputs a control signal to control the phase of the recovery clock, and a phase interpolator which receives the clock signal and generates the recovery clock on the basis of the control signal, and the CDR circuit including a signal output circuit which inputs, to one of the control circuit and the digital filter, a signal to forcibly shift the phase of the recovery data in the negative feedback loop by a predetermined amount, a first counter which counts the number of pulses of the signal output from the signal output circuit in a predetermined period and outputs a first count value, a second counter which counts the number of pulses of the phase comparison result, which has undergone the averaging processing and is output from the digital filter, and outputs a second count value, and a signal processing circuit which receives the first count value and the second count value and compares the first count value with the second count value to determine presence/absence of a capability for absorbing the phase shift generated by the signal, the method comprising, in testing the semiconductor integrated circuit, the steps of:

in a locked state of the CDR circuit, causing the signal output circuit to input, to one of the control circuit and the digital filter, the signal to forcibly shift the phase of the recovery data in the negative feedback loop by the predetermined amount; and causing the signal processing circuit to determine the presence/absence of the capability for absorbing by the negative feedback loop the phase shift generated by the signal.

11. A method according to claim 10, wherein the digital filter receives the phase comparison result from the serial/parallel conversion circuit, executes the averaging processing for the phase comparison result in the predetermined period, and outputs an up signal which advances the phase of the recovery data and a down signal which delays the phase of the recovery data, the second counter counts the number of pulses of each of the up signal and the down signal, which are output from the digital filter, and outputs the second count value, and in the step of determining the presence/absence of the capability for absorbing by the negative feedback loop the phase shift generated by the signal, when the signal input from the signal output circuit to the digital filter is a signal which forcibly advances the phase of the recovery data in the negative feedback loop by the predetermined amount, the signal processing circuit compares the first count value with the number of pulses of the down signal contained in the second count value, and when a difference between the count values falls within a predetermined range, the signal processing circuit determines that the capability for absorbing the phase shift generated by the signal is present.

12. A method according to claim 10, wherein the receiver further comprises a data error detector which receives the recovery data output from the serial/parallel conversion circuit, compares the recovery data with the input data, and outputs a comparison result, and in the step of determining the capability of the negative feedback loop, the comparison result output from the data error detector is supplied to the signal processing circuit, and determination is executed on the basis of the comparison result and a result obtained by determining whether a difference between the first count value and the second count value falls within a predetermined range.

13. A method according to claim 12, wherein in the step of determining the presence/absence of the capability for absorbing by the negative feedback loop the phase shift generated by the signal, determination is executed on the basis of the comparison result output from the data error detector and the result obtained by determining whether the difference between the first count value and the second count value falls within the predetermined range.

14. A method according to claim 11, wherein the receiver further comprises a data error detector which receives the recovery data output from the serial/parallel conversion circuit, compares the recovery data with the input data, and outputs a comparison result, and in the step of determining the capability of the negative feedback loop, the comparison result output from the data error detector is supplied to the signal processing circuit, and determination is executed on the basis of the comparison result and a result obtained by determining whether a difference between the first count value and the second count value falls within a predetermined range.

15. A method according to claim 14, wherein in the step of determining the presence/absence of the capability for absorbing by the negative feedback loop the phase shift generated by the signal, determination is executed on the basis of the comparison result output from the data error detector and the result obtained by determining whether the difference between the first count value and the second count value falls within the predetermined range.

* * * * *